United States Patent
Bodano et al.

(10) Patent No.: US 7,468,622 B2
(45) Date of Patent: Dec. 23, 2008

(54) INTEGRATED CIRCUIT HAVING A BOOTSTRAP CHARGER

(75) Inventors: Emanuele Bodano, Padua (IT); Christian Garbossa, Bressanone (IT); Marco Flaibani, Udine (IT)

(73) Assignee: Infineon Technologies AG, Munich (DE)

( * ) Notice: Subject to any disclaimer, the term of this patent is extended or adjusted under 35 U.S.C. 154(b) by 15 days.

(21) Appl. No.: 11/627,191

(22) Filed: Jan. 25, 2007

(65) Prior Publication Data
US 2008/0007317 A1    Jan. 10, 2008

(30) Foreign Application Priority Data
Jul. 4, 2006  (EP) .................................. 06013877

(51) Int. Cl.
*G05F 1/10* (2006.01)
(52) U.S. Cl. .................. 327/390; 327/589; 327/538; 323/242; 326/88; 330/156
(58) Field of Classification Search .................. None
See application file for complete search history.

(56) References Cited

U.S. PATENT DOCUMENTS 5,638,025 A    6/1997  Johnson
6,225,857 B1 *  5/2001  Brokaw ........................ 327/540
6,836,173 B1   12/2004  Yang
7,026,801 B2 *  4/2006  Fowler et al. ................ 323/271
7,102,395 B2 *  9/2006  Saito ............................ 327/74
7,122,996 B1 * 10/2006  Huang .......................... 323/288
7,145,316 B1 * 12/2006  Galinski, III ................. 323/288
7,321,258 B2 *  1/2008  Wong et al.

FOREIGN PATENT DOCUMENTS

| DE | 10146168 | 4/2003 |
|---|---|---|
| EP | 0367006 | 5/1990 |
| EP | 0725481 | 8/1996 |
| EP | 0743752 | 11/1996 |
| EP | 0751621 | 1/1997 |
| WO | PCT/IB95/00553 | 2/1996 |

* cited by examiner

*Primary Examiner*—Lincoln Donovan
*Assistant Examiner*—Terry L Englund
(74) *Attorney, Agent, or Firm*—Dicke, Billig & Czaja, PLLC

(57) ABSTRACT

An integrated circuit having a bootstrap charger for using in a switching mode power supply is disclosed. In one embodiment, a capacitor is connected between a floating terminal and a bootstrap supply terminal with a voltage drop over the capacitor, a comparing device with a first input terminal receiving a fraction of the voltage drop, a second input terminal receiving a reference, and an output terminal providing a control signal, and a charge circuit configured to charge the capacitor dependent on the control signal.

9 Claims, 4 Drawing Sheets

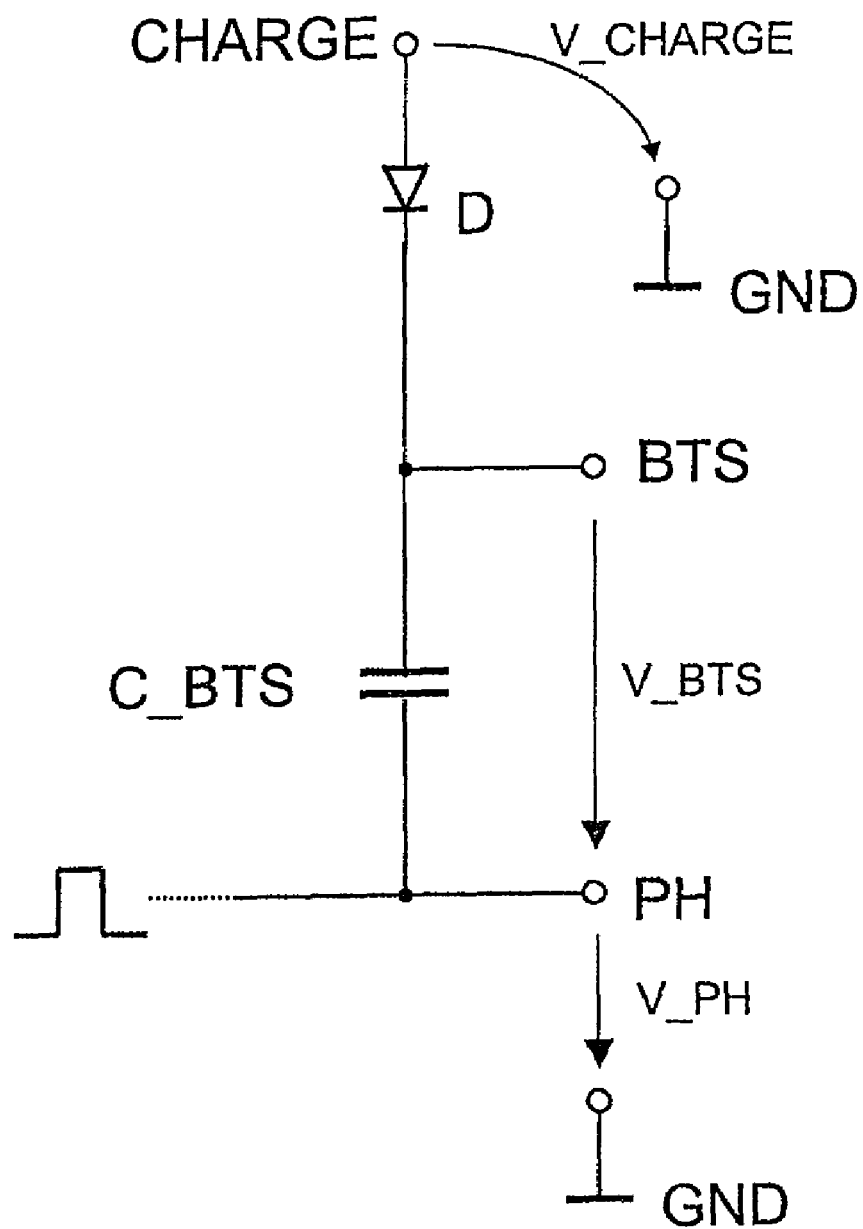
Fig. 4  (conventional circuit)

INTEGRATED CIRCUIT HAVING A BOOTSTRAP CHARGER

CROSS-REFERENCE TO RELATED APPLICATIONS

This Utility Patent Application claims priority to European Patent Application No. EP 06 013 877.3-2215, filed on Jul. 4, 2006, which is incorporated herein by reference.

BACKGROUND

The present invention relates to circuit having a bootstrap charger suitable for using in a switching mode power supply.

A bootstrap charger is a circuit that is responsible for recharging a bootstrap capacitor which forms the supply for high-side switching circuits which for instance are used in a switching mode power supply.

A conventional bootstrap charger is depicted in FIG. 4. A bootstrap capacitor C_BTS is connected between a floating terminal PH of a switching mode power supply and a supply terminal CHARGE via a diode D. When the voltage V_PH of the floating terminal PH goes down close to a reference potential GND, the bootstrap capacitor C_BTS is charged via the diode D until the voltage drop over the bootstrap capacitor C_BTS reaches a certain voltage value V_BTS. If the voltage of the floating terminal PH goes up again the diode D inhibits a discharging of the bootstrap capacitor C_BTS into the supply terminal CHARGE, such that the bootstrap capacitor C_BTS can serve as a floating bootstrap supply providing a bootstrap supply voltage V_BTS with respect to the floating terminal PH. The bootstrap capacitor C_BTS is recharged each time the voltage V_PH of the floating terminal PH goes down close to the reference potential GND. Then the bootstrap supply voltage V_BTS is equal to the supply voltage provided by the supply terminal CHARGE minus the voltage drop over the diode D.

The supply voltage of a bootstrap charger as described above has to be exactly regulated in order to provide a constant bootstrap supply voltage V_BTS. The floating bootstrap capacitor C_BTS could also be be charged via a voltage regulator, but in such an embodiment the voltage drop over the regulator would be unacceptably high, or, if a more sophisticated circuit is used to avoid this, the necessary chip area would be too high.

The voltage drop between the supply voltage and the bootstrap supply voltage is rather high, that is the voltage drop over the diode and over the voltage regulator devices. Furthermore the imprecise control of the bootstrap voltage, a long response time during switching, and the required chip area for the charger underline the need for further improvement.

For these and other reasons, there is a need for the present invention.

SUMMARY

One embodiment provides an integrated circuit including a capacitor having a voltage drop across the capacitor. Another embodiment includes a comparator having a first input defined as a portion of the voltage drop, a second input defined as a reference voltage, and an output control signal, and a charge circuit configured to charge the capacitor based on the control signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a conventional bootstrap charger.

DETAILED DESCRIPTION

Figure 1:
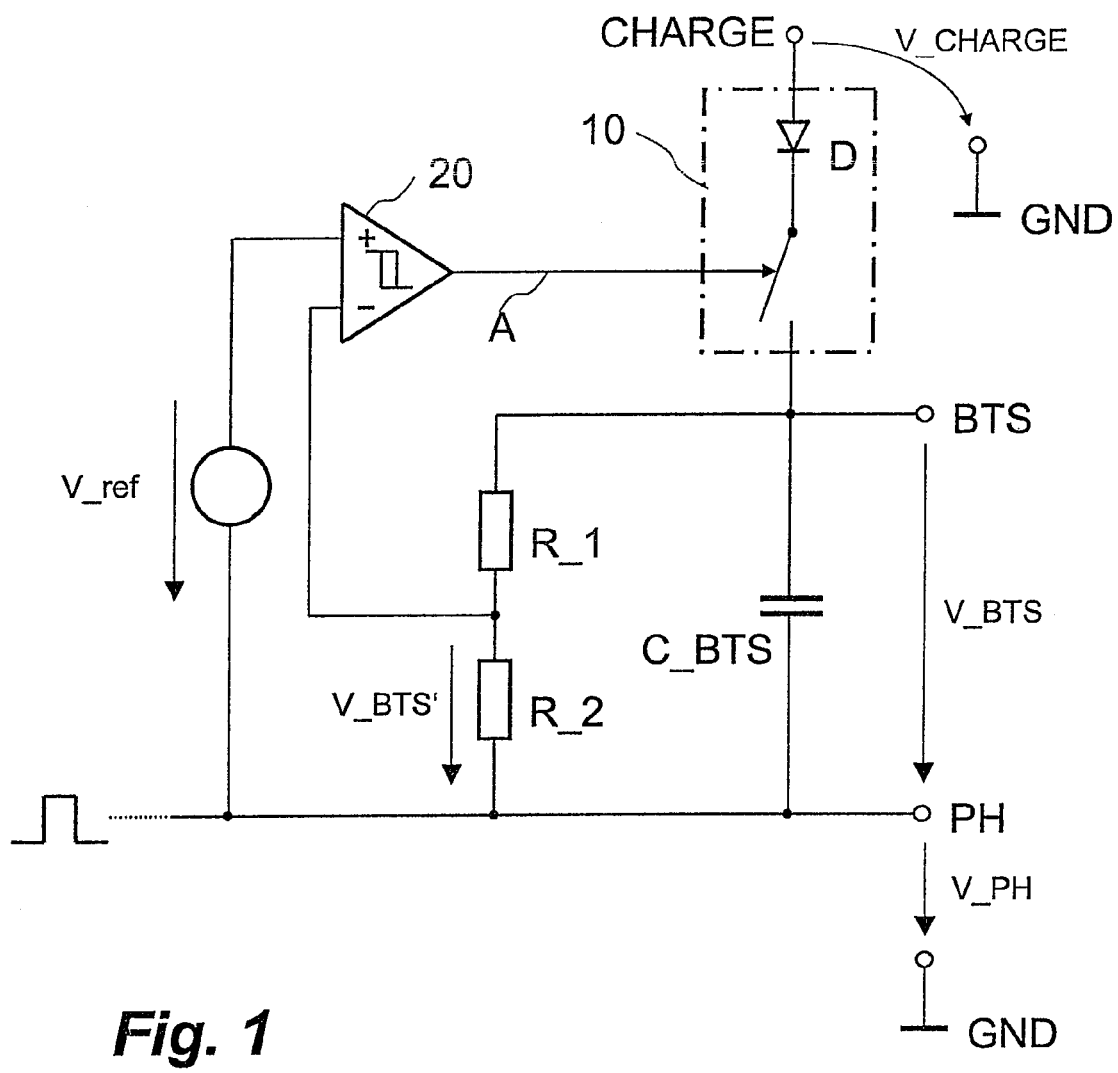
FIG. 1 illustrates a basic embodiment of an inventive bootstrap charger.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment of the invention a fraction of the voltage drop over the bootstrap capacitor is compared with a reference voltage and to charge the bootstrap capacitor dependent on the result of that comparison.

In another embodiment the bootstrap charger includes a capacitor connected between a floating terminal and a bootstrap supply terminal. During operation the capacitor serves as floating power supply for high side power switches used in a switching mode power supply. The bootstrap charger further includes a comparing device (e.g., a comparator) with a first input terminal receiving a fraction of the voltage drop over the capacitor, a second input terminal receiving a reference voltage, and an output terminal providing a control signal. If the fraction of the voltage drop over the capacitor falls below a first threshold determined by the reference voltage, the control signal switches to high level. If the fraction of the voltage drop over the capacitor raises above a second threshold also determined by the reference voltage, the control signal switches to a low level.

The bootstrap charger further includes a charging means adapted for charging the capacitor, wherein the charging means charge the capacitor dependent on the control signal, i.e., if the control signal is at a high level, the capacitor is charged until the control signal again switches to a low level.

The charging means typically include a semiconductor switch receiving the control signal. A MOS-transistor is used as a semiconductor switch, but the MOS-transistor is exchangeable with a bipolar transistor or an IGBT without problems. The gate terminal of the MOS transistor is connected to the comparing device via a second capacitor, the drain terminal is connected to a supply terminal which provides a supply voltage for charging the bootstrap capacitor, and the source terminal is connected to the bootstrap capacitor. The gate of the MOS transistor is also connected to the bootstrap supply terminal via a diode.

The above mentioned fraction of the voltage drop over the bootstrap capacitor is typically provided by a voltage divider whose input terminals receive the voltage drop over the bootstrap capacitor.

The bootstrap charger described above provides an exactly regulated bootstrap supply voltage due to the use of a reference voltage and a very fast recharging of the bootstrap capacitor by directly connecting it to the supply voltage via a semiconductor switch having a low on-resistance.

One embodiment of the inventive bootstrap charger illustrated in FIG. 1 includes a bootstrap capacitor C_BTS connected between a floating terminal PH and a bootstrap supply terminal BTS with the voltage drop V_BTS over the bootstrap capacitor. The circuit further includes a charging device or means 10 adapted for charging the bootstrap capacitor C_BTS and connected between the bootstrap supply terminal BTS and a supply terminal CHARGE. In one embodiment, the charging means 10 includes a semiconductor switch which receives a control signal A provided by a comparator 20 with a first input terminal receiving a fraction V_BTS' of the voltage drop V_BTS of the bootstrap capacitor, and with a second input terminal receiving a reference voltage V_ref with respect to the floating terminal PH. The semiconductor switch is controlled by the comparator 20, so that the bootstrap capacitor C_BTS is charged dependent on the control signal A provided by the comparator 20.

The fraction V_BTS' of the voltage drop V_BTS of the bootstrap capacitor is provided by the output of a voltage divider built of the two resistors R_1 and R_2 connected in series between the bootstrap supply terminal BTS and the floating terminal PH. So the first input terminal of the comparator 20 is connected with the junction between resistor R_1 and resistor R_2. To inhibit a reverse current flowing into the supply terminal charge the charging means includes a diode D which is connected between the supply terminal charge and the semiconductor switch 10.

Figure 2:
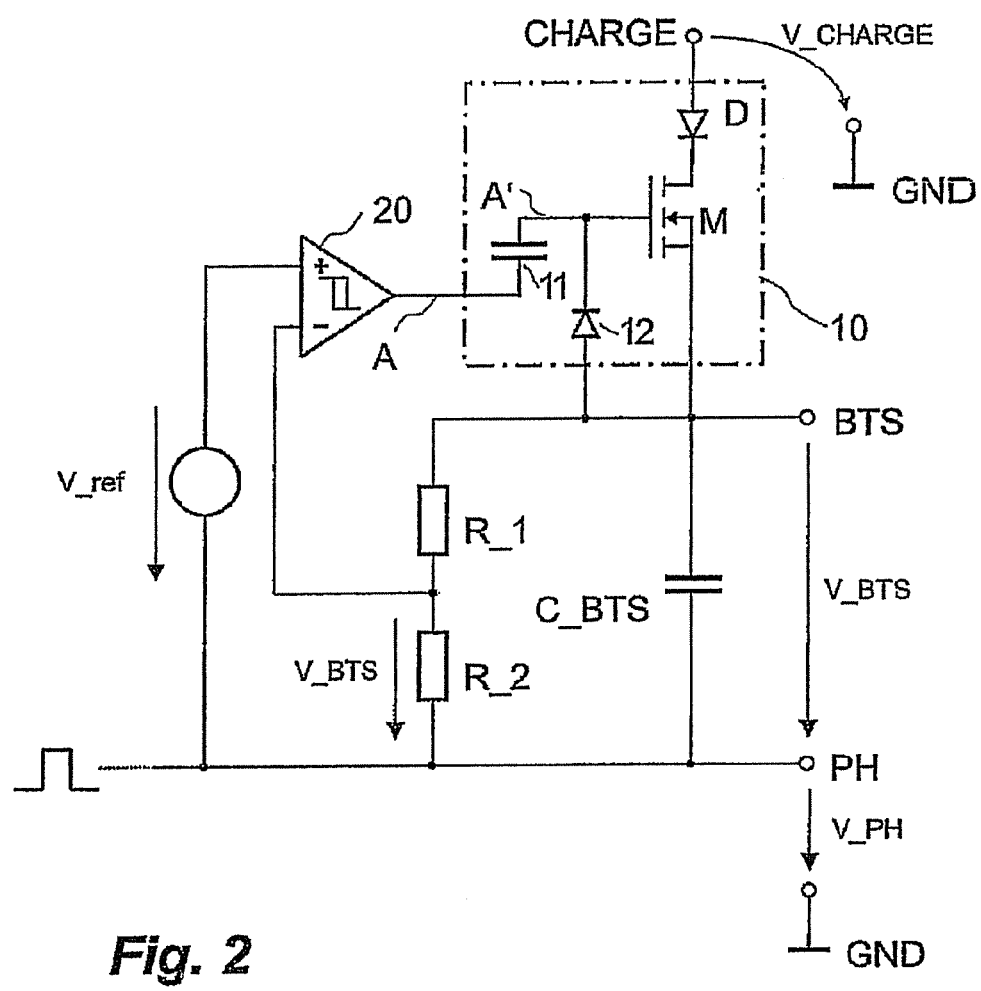
FIG. 2 illustrates another embodiment of the inventive bootstrap charger according to FIG. 1, wherein the charging means is illustrated in more detail.

FIG. 2 illustrates the charging means 10 including the semiconductor switch in more detail. A MOS transistor M is used as a semiconductor switch having a drain terminal connected to the supply terminal CHARGE via the diode D, further having a source terminal connected to the bootstrap supply terminal BTS and a gate terminal connected to the comparator 20 via a second capacitor 11 and connected to the bootstrap supply terminal BTS via a second diode 12.

Figure 3:
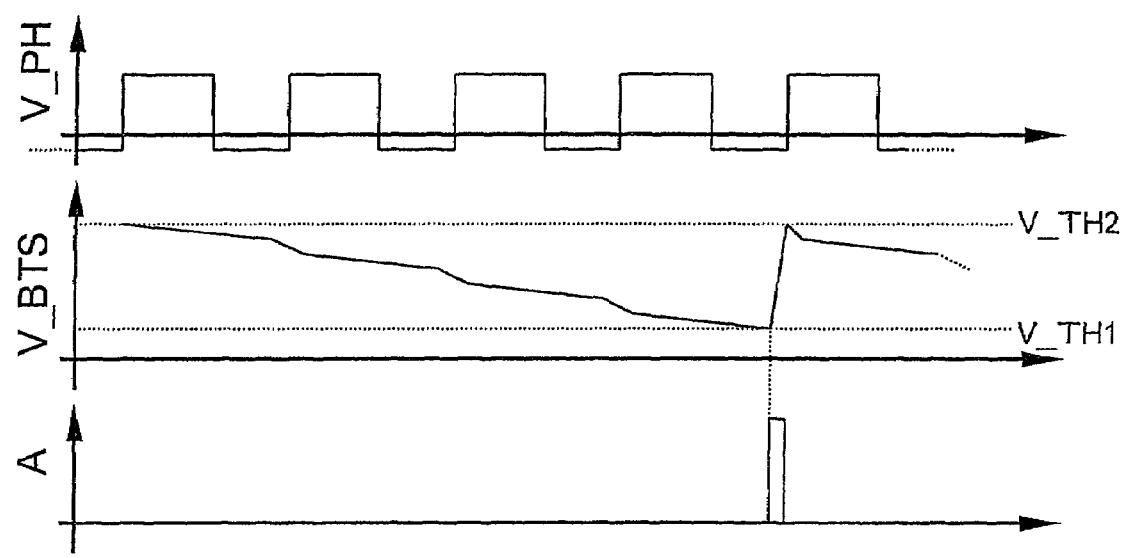
FIG. 3 illustrates a timing diagram for the bootstrap charger illustrated in one of the FIGS. 1 or 2.

The function of the circuits depicted in the FIGS. 1 and 2 is now described on the basis of the timing diagrams illustrated in FIG. 3. The upper diagram illustrates a typical example for the voltage V_PH of the floating terminal PH with respect to a ground potential GND. The voltage-signal V_PH raises from a low level to a high level when a high side switch of, e.g., a switching supply is closed. Every time the high side switch is closed some current flows from the bootstrap capacitor C_BTS into the high side switch and the voltage drop V_BTS over the bootstrap capacitor C_BTS is reduced. Leakage currents also reduce the voltage drop V_BTS. If the voltage drop V_BTS falls below a certain threshold V_TH1 the output signal A of the comparator 20 goes from a low level to a high level thus triggering the semiconductor switch of the charging means 10 such that the bootstrap capacitor C_BTS is quickly recharged.

If, for example, the semiconductor switch 10 is designed as illustrated in FIG. 2 the second capacitor 11 is charged by the bootstrap capacitor C_BTS via the diode 12 if the output signal of the comparator 20 is at a low level. If the voltage drop V_BTS over the capacitor C_BTS drops below a certain first threshold V_TH1 the output signal A of the comparator 20 switches to a high level and, since the second capacitor 11 can not discharge, the potential A' controlling the gate of the MOS transistor is high enough for the transistor to turn on such that the bootstrap capacitor C_BTS is quickly recharged until the voltage drop V_BGS reaches a second threshold V_TH2.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A system having a circuit comprising:
   a capacitor connected between a floating terminal and a bootstrap supply terminal with a voltage drop over the capacitor;
   a comparing device with a first input receiving a fraction of the voltage drop, a second input receiving a reference voltage, and an output providing a control signal; and
   a charging circuit adapted for charging the capacitor, wherein the charging circuit includes a transistor having a control terminal connected to the comparing device via a second capacitor and wherein the control terminal is connected to the bootstrap supply terminal via a rectifying element, a first load terminal connected to a supply terminal, and a second load terminal connected to the capacitor;
   wherein the charging circuit is configured to charge the capacitor dependent on the control signal.

2. The system of claim 1, comprising wherein the transistor is a MOSFET or a IGBT.

3. The system of claim 1, comprising wherein the transistor is a bipolar transistor.

4. The system of claim 1, comprising wherein the fraction of the voltage drop is provided by a voltage divider comprising a first input terminal and a second input terminal, the first input terminal being connected to the bootstrap supply terminal and the second input terminal being connected to the floating terminal.

5. The system of claim 1, comprising:
   a semiconductor chip coupled to the circuit.

6. A bootstrap charger, comprising:
   a capacitor connected between a floating terminal and a bootstrap supply terminal with a voltage drop over the capacitor;
   a comparing device with a first input terminal receiving a fraction of the voltage drop, a second input terminal receiving a reference voltage, and an output terminal providing a control signal; and
   charging means adapted for charging the capacitor, wherein the charging means includes a transistor having a control terminal connected to the comparing device via a second capacitor and the control terminal is connected to the bootstrap supply terminal via a rectifying element, a first load terminal connected to a supply terminal, and a second load terminal connected to the capacitor;
   wherein the charging means charges the capacitor dependent on the control signal.

7. The bootstrap charger of claim 6, comprising wherein the transistor is a MOSFET or a IGBT.

8. The bootstrap charger of claim 6, comprising wherein the transistor is a bipolar transistor.

9. The bootstrap charger of claim 6, comprising wherein the fraction of the voltage drop is provided by a voltage divider comprising a first input terminal and a second input terminal, the first input terminal being connected to the bootstrap supply terminal and the second input terminal being connected to the floating terminal.

* * * * *

UNITED STATES PATENT AND TRADEMARK OFFICE
CERTIFICATE OF CORRECTION

PATENT NO. : 7,468,622 B2
APPLICATION NO. : 11/627191
DATED : December 23, 2008
INVENTOR(S) : Bodano et al.

Page 1 of 1

It is certified that error appears in the above-identified patent and that said Letters Patent is hereby corrected as shown below:

Title Page, Item [75] Inventors, delete "Padua" and insert in place thereof --Padova--.

Signed and Sealed this

Third Day of November, 2009

David J. Kappos
*Director of the United States Patent and Trademark Office*